(12) United States Patent
Heiland et al.

(10) Patent No.: US 7,234,913 B2
(45) Date of Patent: Jun. 26, 2007

(54) FAST SWAPPING STATION FOR WAFER TRANSPORT

(75) Inventors: Peter Heiland, Raunheim (DE); Ralf Tillmann, Mannheim (DE)

(73) Assignee: Integrated Dynamics Engineering GmbH, Raunheim (DE)

( * ) Notice: Subject to any disclaimer, the term of this patent is extended or adjusted under 35 U.S.C. 154(b) by 140 days.

(21) Appl. No.: 10/810,361

(22) Filed: Mar. 26, 2004

(65) Prior Publication Data

US 2005/0129496 A1  Jun. 16, 2005

(30) Foreign Application Priority Data

Mar. 28, 2003  (DE) .............................. 103 14 383

(51) Int. Cl.
*B65H 5/00*  (2006.01)
(52) U.S. Cl. .................. 414/806; 294/116; 294/119.1; 414/751.1; 414/753.1; 414/941; 901/31; 901/39
(58) Field of Classification Search ............. 414/749.1, 414/751.1, 752.1, 753.1, 941, 800, 806; 294/116, 294/119.1; 901/31, 39
See application file for complete search history.

(56) References Cited

U.S. PATENT DOCUMENTS

| | | | | | |
|---|---|---|---|---|---|
| 3,401,974 | A | * | 9/1968 | Martelee | 294/88 |
| 4,451,197 | A | * | 5/1984 | Lange | 414/737 |
| 4,968,077 | A | * | 11/1990 | Redmon et al. | 294/16 |
| 6,039,375 | A | * | 3/2000 | Bauman | 294/119.1 |
| 6,074,163 | A | * | 6/2000 | Yamazaki et al. | 414/795.5 |
| 6,530,616 | B1 | * | 3/2003 | McIntosh et al. | 294/106 |

* cited by examiner

*Primary Examiner*—Donald Underwood
(74) *Attorney, Agent, or Firm*—Ohlandt, Greeley, Ruggiero & Perle, L.L.P.

(57) ABSTRACT

An apparatus for accepting and transferring at least one disk-like member is provided. The apparatus includes a pick- and place-mechanism including gripping means. In effect, the mechanism is adapted to provide pick- and/or place-cycles, which during operation provides a movement of said gripping means between an up and a down position and vice versa, whereby, in the down position, said gripping means either picks the disk-like member from a load position or places the disk-like member onto the load position.

35 Claims, 10 Drawing Sheets

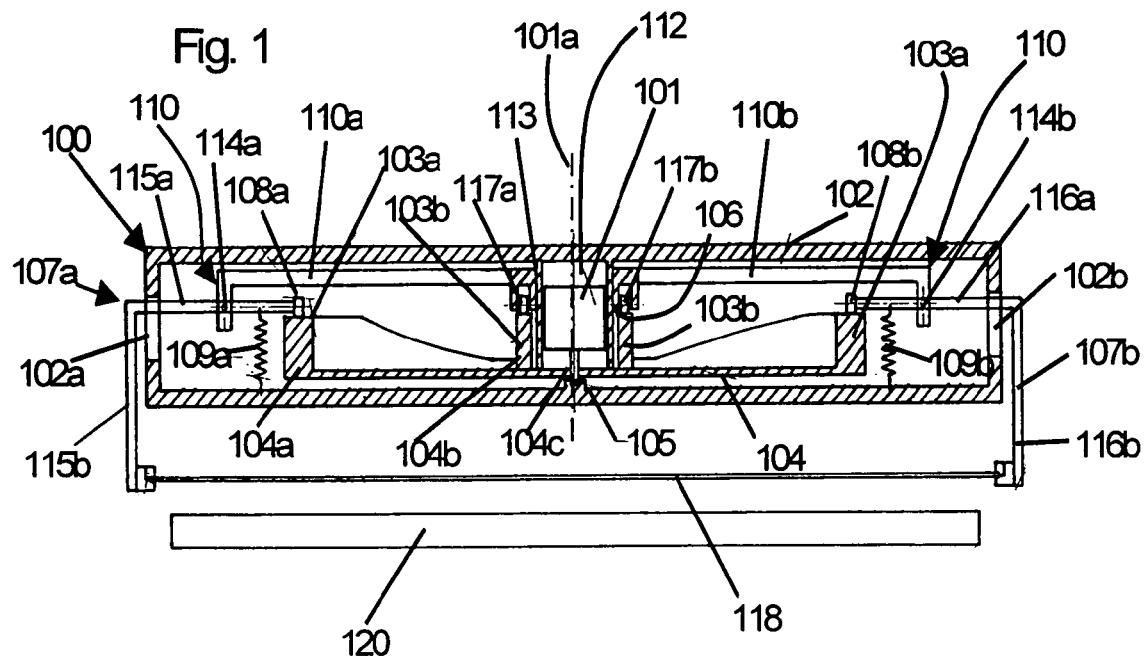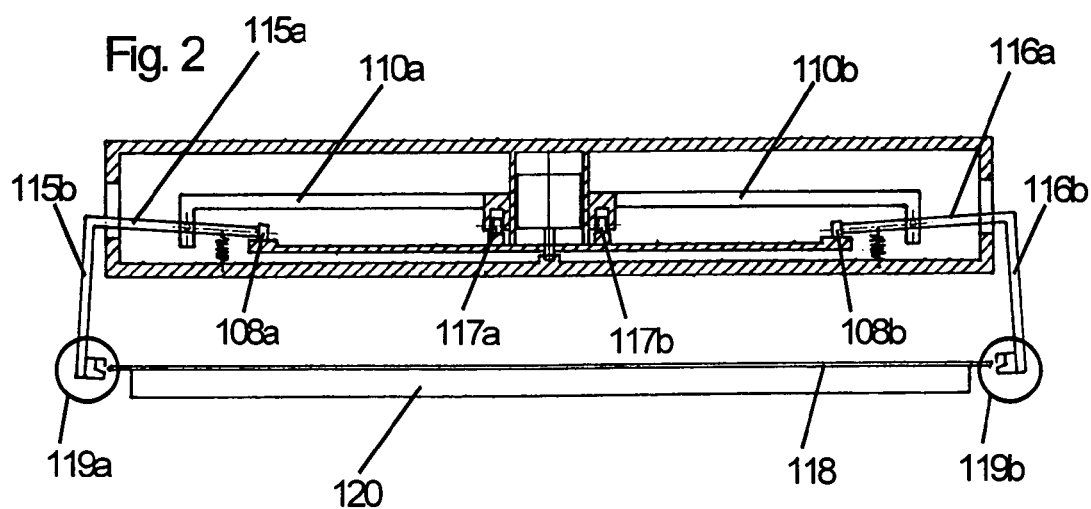

Fig. 13
Fig. 13A
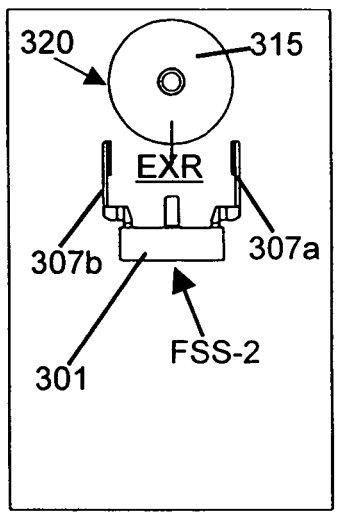
Fig. 13B
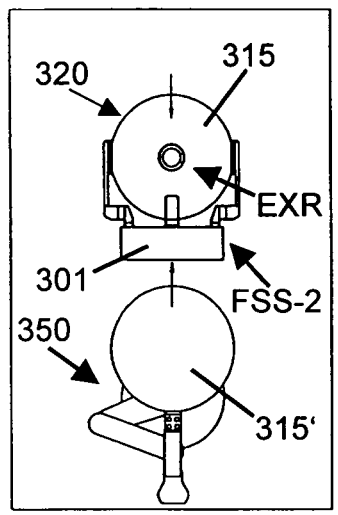
Fig. 13C
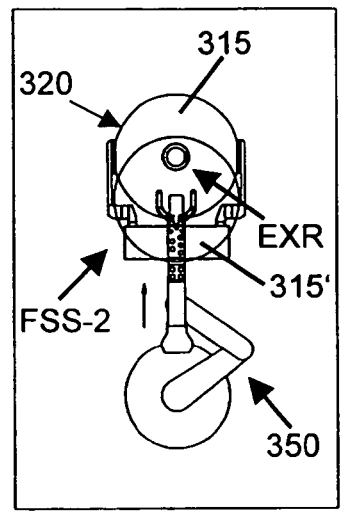
Fig. 13D
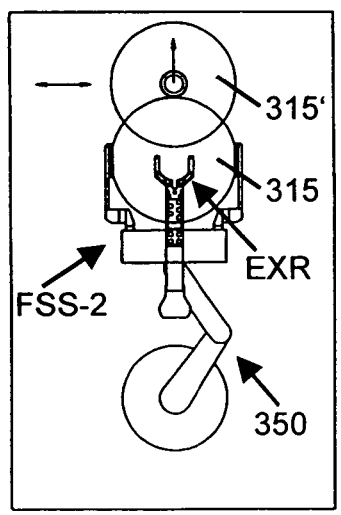
Fig. 13E
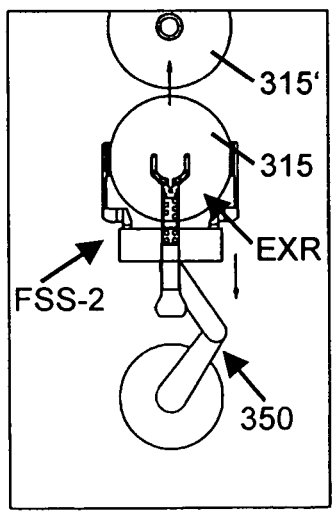
Fig. 13F
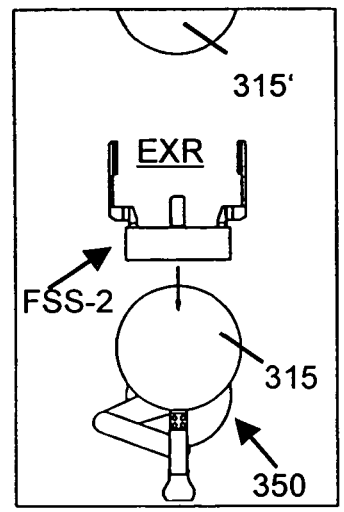

Fig. 14
Fig. 14A
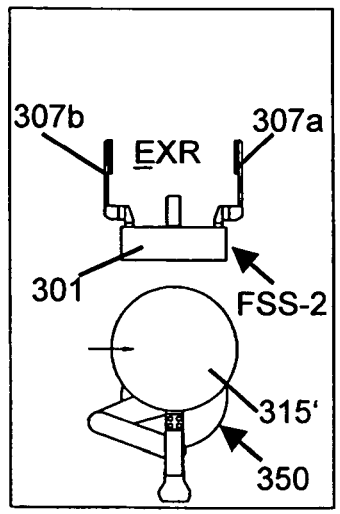
Fig. 14B
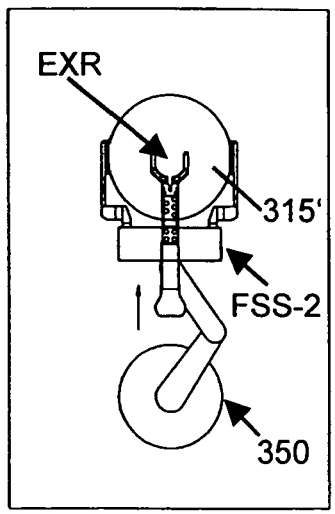
Fig. 14C
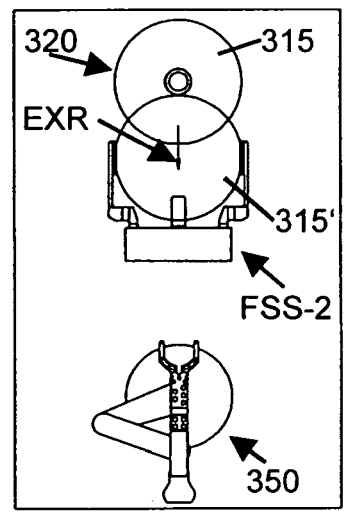
Fig. 14D
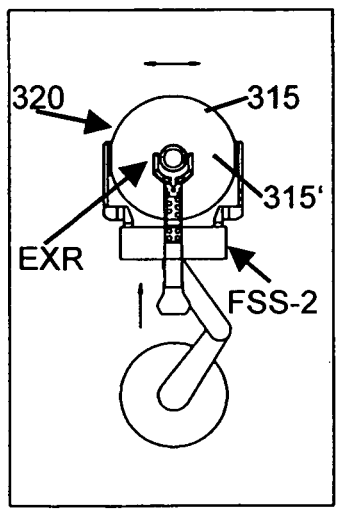
Fig. 14E
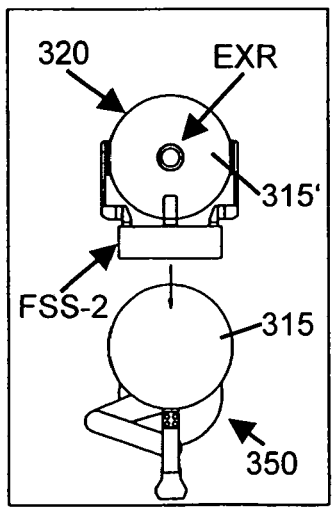
Fig. 14F
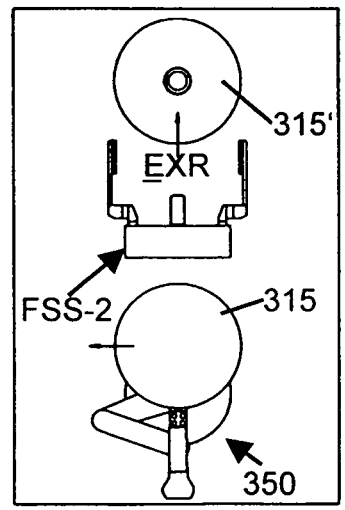

FAST SWAPPING STATION FOR WAFER TRANSPORT

BACKGROUND OF THE INVENTION

1. Field of the Invention

The invention relates to an apparatus for swapping at least one disk-like member, a method for transporting wafers, and a handling line for carrying out the method for transporting wafers.

2. Description of Related Art

Apparatus for accepting and transferring wafers are well known in the art. For instance, robot handlers are commonly used to move materials, e.g. semiconductor wafers, between different stages of a wafer fabrication process. In this regard, robot handlers might be used to move the wafer from a plasma etch station in a cluster tool to a deposition station or from a manufacturing station to a testing station or metrology tool, wherein the wafer is positioned onto a chuck. In this kind of handling system the throughput depends strongly on the time the metrology tool has to wait for material handed over by the robot handler.

A typical transporting or handling scenario for a wafer handling system is the following:

a) the handling system, typically a one-arm-robot-handler gets a new wafer, b) the handling system moves and loads the wafer onto the transfer position for transferring the wafer for example into the metrology tool, c) the wafer gets moved into the tool for processing or measuring; after this the wafer gets back to the transfer position or unload position which is typically the same as the load position, d) the handling system, i.e. the robot handler, picks the wafer and unloads the wafer to the next position, The cycle starts from step a)

During the processing of the wafer in the metrology tool the handling system or robot waits or is doing different tasks. But for doing different tasks the handling system has to do motions without wafer. This however is ineffective and forms a bottleneck of the transport system, which limits the throughput.

The problem might be solved by employing a so-called dual-arm or paddle-robot that can handle two wafers at the same time. However, such a handling system has a increased footprint, since the arms increase the sweep radius of the robot, which is caused by the space that is needed horizontally to swap the wafer at the desired station.

Yet, space in a clean room environment, which is commonly needed for wafer production, is a scarce resource. Therefore, an increase in food print of the handling system would raise production costs considerably. Moreover these kind of robots are more complex in handling and their purchase price is high.

Therefore, a solution is needed which on the one side increases the throughput and on the other minimizes the space consumption and the additional footprint, respectively, needed.

These and other disadvantages have lead to the object of the present invention to provide an apparatus as a part of a handling system which avoids to use complex handling systems with a big footprint but nevertheless can increases the throughput considerably.

SUMMARY OF THE INVENTION

The inventive solution is obtained by the provision of an apparatus for swapping at least one disk-like member, e.g. a wafer. The apparatus includes at least two tong-like arms for accepting and holding the disk-like member and a driving-mechanism adapted to drive the arms. The mechanism is adapted to provide a first and a second movement of the arms, whereby the first movement is a vertically oriented movement of the arms and the second movement is a horizontally oriented tong-like movement of the arms.

Thus far, in general, the invention is an apparatus for swapping at least one disk-like member, e.g. a wafer, the apparatus comprises at least two tong-like arms for accepting and holding the disk-like member and a driving-mechanism adapted to drive the arms, wherein the mechanism is adapted to provide a first and a second movement of the arms, whereby the first movement comprises a vertically oriented movement of the arms from an up to a down position and vice versa, and whereby the second movement comprises a horizontally oriented tong-like movement of the arms.

The inventive apparatus, for example, can be advantageously simply arranged in-line or in series to an one arm handling system and a load position of, for instance, a chuck of a motion system which transfers a disk-like member or a wafer, e.g. into a testing station. In this regard the inventive apparatus is able to accept, hold or store the disk-like member with its tong-like arms, being driven by the driving mechanism, from the handling system, whereby, after having placed the disk-like member or wafer into the arms of the inventive apparatus, the unloaded handling system can pick another wafer from, for instance the chuck, coming out of the testing station. If these steps are completed, the inventive apparatus is highly advantageous able to transfer or place or swap the stored wafer with its tong-like arms on the load position or chuck to be transferred into the testing station. Of course, the just described cycle works also the other way round. Thus, any motion of the handling system without wafer can be avoided if the inventive apparatus is applied.

It should be emphasis that according to the invention the term disk-like member, in its meaning, comprises any kind of member which can be swapped or transferred by means of the inventive apparatus, or which is adapted to be used within the inventive process. Thus, in the inventive sense disk-like members can be, for instance, round like a wafer, or rectangular like a plate, or can be of any appropriate shape.

With regard to an advantageous further development of the inventive apparatus a lever apparatus and/or spindle means is provided which controls or governs the movement of the tong-like arms. Thus, the lever apparatus and/or spindle means together with the inventive driving mechanism, at least guarantees a movement of the tong-like arms into one hold and into one release position and vice versa. The hold position is characterized by the fact that in this position the arms are ready to accept and/or to hold a disk-like member or wafer, whereas in the release position the arms are opened such that a disk-like member can be charged or discharge by the arms. Thereby, it is guaranteed that especially in the case when the arms charge or grip a disk-like member or wafer the distance between the arms and the arms and the dislike member, respectively, is such that there will be no damage of the disk-like member.

According to an additional advantageous further development of the inventive apparatus the driving mechanism is separated into an elevation contrivance and a manipulator drive. The manipulator drive causes the arms to perform a tong-like move in a plan, whereas the elevation contrivance preferably moves the arms and/or the manipulator up and down, i.e. in a direction preferably perpendicular to the plan defined by the tong-like movement of the arms. Advantageously, both movements, and thus both apparatus can be controlled independently.

Yet, with regard to another preferred embodiment of the invention, it is provided that the driving mechanism or the manipulator drive comprises the functionality to move the arms into two different hold positions and into two release positions corresponding to the hold positions. This kind of functionality gives the possibility to use the inventive apparatus for different kind of disk-like members, e.g. for wafer with different diameters. So far, the inventive apparatus might be for example used for wafer seizes with a diameter of 200 mm or of 300 mm.

In connection with this, the invention also provides extension members that are part of the arms, and which advantageously allow to flexible adjust the feed opening or the distance between the arms. This opens up the possibility to use the inventive apparatus for swapping disks with not only two or three different diameters but with all kind of diameters.

Another structural element of the invention which positively further develops the inventive apparatus is given if the apparatus comprises gripping means which helps the arms to grip the disk-like member. The gripping means contacts the edges of the disk-like member, when it is held or gripped by the inventive apparatus or tong-like arms. For that purpose, advantageously the gripping means comprises at least one grooved circular ring section, which is adapted to the radius or diameter of the wafer to be gripped.

For to provide a compact assembly the inventive apparatus comprises a housing, wherein at least a part of the driving mechanism for the tong-like arms is accommodated. Thereby openings are provided through which the arms extend for to grip the disk-like member. Advantageously, moreover, it is given that the arms are formed in a way that enables the apparatus and the arms respectively to be front- or to be back-loaded. Front-side in this respect is the side to which the arms extend to, and back side is the side in opposition to the front-side.

According to another further development of invention the inventive apparatus or driving mechanism comprises at least one driving motor, which one the one side drives the vertical movement of the tong-like arms via the lever apparatus and/or spindle and which on the other side also drives the horizontal movement of the arms.

Highly advantageously, according to the invention, the inventive apparatus also comprises sensor means for detecting the disk-like member, i.e. for to tell the apparatus whether there is a disk-like member or not inside the inventive apparatus and/or for detecting the position of the tong-like arms. For the latter purpose sensors, for instance, can be arranged in pairs with respect to the arms such that they are able to indicate at least two different relative positions of the arms to each other. In this respect, one of the sensor, for example, could indicate the hold position of the respective arm and the other the release position of the respective arm. The same applies if the inventive apparatus is dimensioned for disk-like members of different diameter, whereby for each disk-like member a hold and a release position can be defined via the arrangement of sensors or via sensor readings. Moreover, sensors could be provided which indicate the height of the arms with respect to a defined level.

According another aspect of the invention the inventive apparatus favorably comprises or is connectable to control means for controlling the movement of the arms and/or motor drives etc. For that purpose appropriated interfaces and at least one micro-controller are/is provided.

Additionally to the above stated, it is a further object of the present invention to provide a method which by use of the inventive apparatus avoids to use complex handling systems but nevertheless increases the throughput considerably.

Therein a method for handling or transporting disk-like members, e.g. wafers, is defined, wherein an apparatus as described above is positioned into an exchange-region for exchanging dislike-members, for that purpose a first disk-like member with first transport means from a first position is transported to the exchange region, at the exchange region the first disk-like member is loaded into the inventive apparatus, after or parallel to the latter load or even before the latter load a second disk-like member with second transport means is transported to the exchange region, the second disk-like member, after having unloaded the first transport means, the second disk-like member is loaded from the second transport means to the first transport means, and after having unloaded the second transport means, the first disk-like member gripped, loaded or charged by the inventive apparatus is transferred from the inventive apparatus to the second transport means, if this is done the second disk-like member can be transported to a second position by means of the second transport means. The cycle can start again.

An even further object of the invention is to provide a handling line to accomplish the just described method. The inventive handling line comprises respective means for carrying out the method. Thus, in particular, it might comprises a x-y-stage or a chuck and/or a robot to replace either the first or the second transport means.

BRIEF DESCRIPTION OF THE DRAWING

The invention together with additional features and additional advantageous thereof will be best understood from the following description.

It is shown:

FIG. 1 a cross-sectional view of one embodiment of an apparatus according to the invention wherein the tong-like arms are in the up position, FIG. 2 the cross-section as shown in FIG. 1, wherein the tong-like arms are in the down position, FIG. 3 a top view a portion of FIG. 1 illustrating the wafer, the arms, and the grippers of the arms, FIG. 4 a cam disk top view with two cam rings, FIG. 5 a topography or profile of the cam rings of the cam disk according to FIG. 6

FIG. 13 the handling process if an apparatus according to the invention is used, in case the inventive apparatus is first front-loaded, FIG. 14 the handling process or FIG. 8 with the difference that the inventive apparatus is first back-loaded.

DETAILED DESCRIPTION

Figure 3:
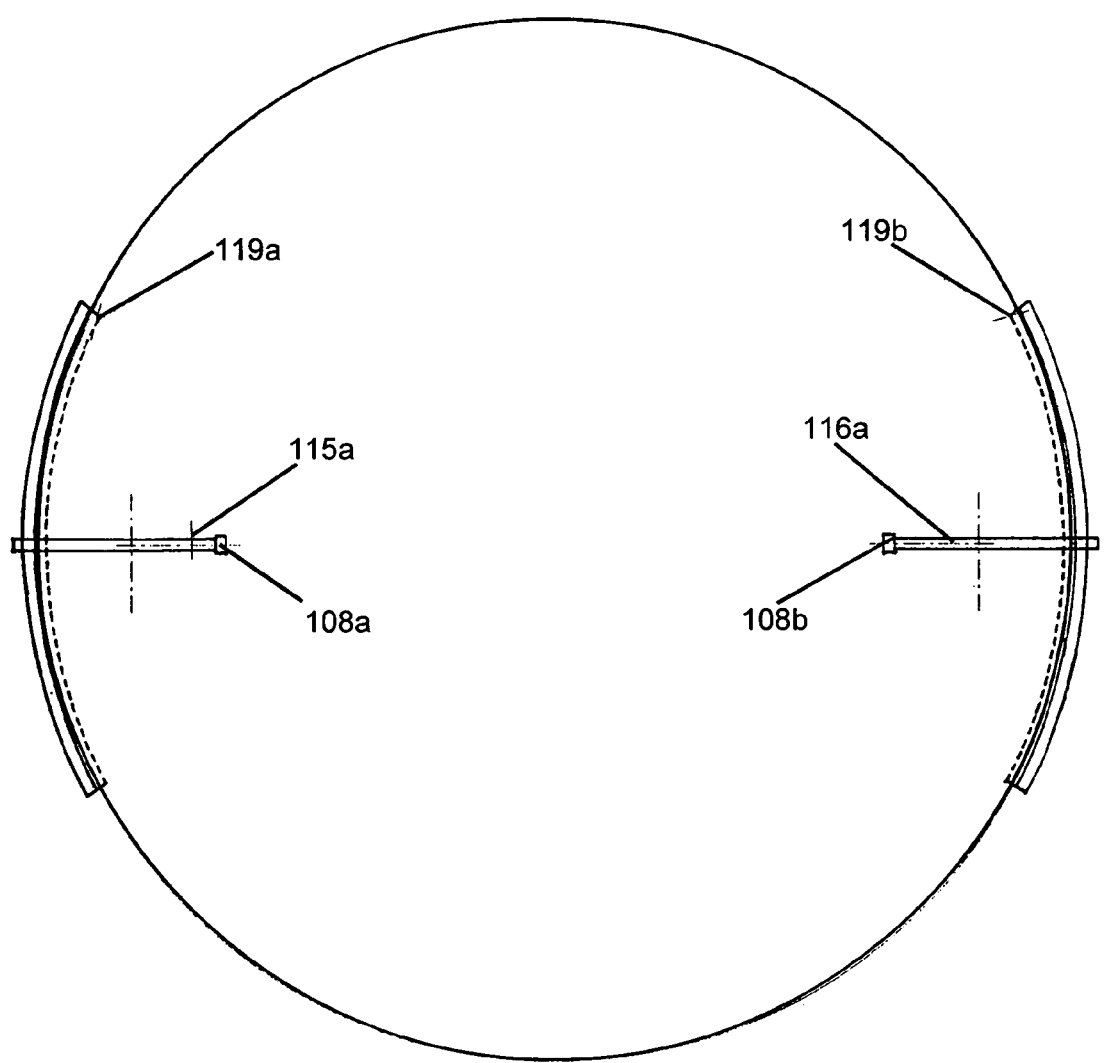

FIGS. 1 and 2 are showing a design of the inventive apparatus generally referred to hereinafter to be a Fast swapping station (FSS-1). The inventive fast swapping station comprises a driving mechanism 100 and tong-like arms 107a and 107b. The propulsive power of driving mechanism 100 is provided by motor 101. The motor 101, which is fixed to the top part of the housing 102 is mounted in the center of the housing 102 of the driving mechanism 100 and rotates the cam plate 104. The housing 102 has a cylinder box structure with openings 102a and 102b in its cylinder-jacket, whereby the openings 102a and 102b are arranged opposed to each other. The driving axis 101a of the motor 101 is fixed in the mounting hole 104c of the plate 104. The disk or plate 104 has two higher circles or rings 104a and 104b with a changing topography in height which reflects the cam structures 103a and 103b on the disk 104 (see also FIG. 4). The rotating plate 104 and the driving axis 101a are supported by the bearing 105 at the center of the lower part or bottom side of the housing 102. In side the housing, centrally arranged, a space 112 is provided which accommodates the motor 101. The space is formed by a wall 113 surrounding the motor and is adapted to the geometry of the motor, e.g. cylindrical, together with the upper part or top surface of the housing 102, to which the wall 113 is integrally attached to, and from which it extends down to the bottom of the housing and the plate 104. The wall 113, being in touch with the motor 101 at its inner side, is the inner part of a sliding bearing 106 at its outside. The counter or outer part of this sliding bearing 106 is the inside of an opening of the support structure 110 (110a and 10b) which is riding with two rollers 117a and 117b on the inner circle 104b with the cam structure or contour profile 103b. This support structure 110 holds two arms 107a and 107b. The arms 107a and 107b are rectangular in shape and comprise two legs 115a, 115b and 116a, 116b each, namely upper legs 115a and 116a and side legs 115b and 116b.

For the sake of simplicity the structure and function of only one of the arms 107a and 107b is described further, whereby the arms 107a and 107b are in structure and functionality the same except that they are arranged in opposition or mirror relationship to each other.

The upper leg 115a of the arm 107a has been inserted into or extends through the opening 102a of the housing 102, and is moveably attached to the fulcrum 114a of holding arm 110a of the support structure 110 to form a lever apparatus, which allows the upper leg 115a under defined circumstance, which will be described hereinafter, to change its angle with respect to the horizontal line and the holding arm 110a respectively. The upper leg 115a with its end inside of the FSS-1 housing 102 has a roller 108a rotatably fixed at its end, whereby the roller 108a is supported by the second topography 103a of the rotating plate 104. The upper leg 115a, and thus the support structure arm 110a too, is held down or pushed against to the contour circles 104a or cam structure 103a with the spring 109a. For this purpose the spring 109a is fixed to the upper leg 116a and the bottom part of the housing 102 at a point between the roller 108a and the bearing fulcrum 114a depending on the force to be excerpted on to the upper leg 115a and the contour profile 103a, respectively.

Thus, by rotating the plate 104 the rollers 117a and 117b of the support structure 110 will follow the topography of the cam structure 103b, and the rollers 108a and 108b of the arms 107a and 107b will follow the topography of the cam structure 103a, whereby the arms 107a, 107b perform a tong-like movement. It is the difference between the two profiles of the two cam structures 103a and 103b that causes a change in the relative position between the support structure 110 and the arms 107 (107a and 107b). In this regard FIG. 1 shows the support structure 110 to be pushed up upon rotation of plate 104, and the arms with their upper legs 115a and 116a are pushed up to the same height as well. This is the situation in which the arms can hold a wafer 118 or, in case there is no wafer, can accept or store a wafer from a robot handler of a wafer handling system.

FIG. 2 shows the support structure down upon rotation of the plate 104, and the arms support 103a is even more down, because at the angular position of plate 104, shown in FIG. 2, the rollers 108a and 108b of the arms 107a and 107b, respectively, are pushed down to a lower height than that of rollers 117a and 117b which results in a counter clockwise movement of the arm 107b and a clockwise movement of the arm 107a, up to a defined angle, that depends on the cam structure differences in height at the down position, whereby the side legs 115b and 116b are pushed aside like the arms of a tongs. In this case the arms 107 (107a and 107b) are opened in a down position to release the wafer 118 to a chuck 120 or to accept the wafer 118 from the chuck 120.

The grippers or retaining zones 119 (119a and 119b) of the arms for to hold the wafer consists of two circular ring or rim sections 119a and 119b, which radius is adapted to that of the wafer (FIG. 3). In the cross-sectional view of FIG. 1 or 2 it can be seen that the ring sections 119a, 119b comprise retaining grooves, whereby the cross-section of the grooves deviates slightly from a "L". In this respect, the vertical part makes an angle with the lower part which is bigger than 90°. Thus, the wafer can be easily gripped into the retaining zone 119 without pinching and damaging it. In the hold position of the arms 107 the wafer sits on the lower part of the groove and the vertical part or raising edge of the groove keeps the wafer 118 at a defined position, i.e. radius, during motion. This can be even better seen in FIG. 3. Therein the dashed lines mark the end of the grippers or retaining zones.

The gripping mechanism of the FSS-1 is the like that the arms 107 open wide enough and closes slowly enough that when the arms 107a and 107b are pushed upwards to the up or hold position, whereby the grippers 119 pass the wafer without touching it on its way up.

Figure 4:
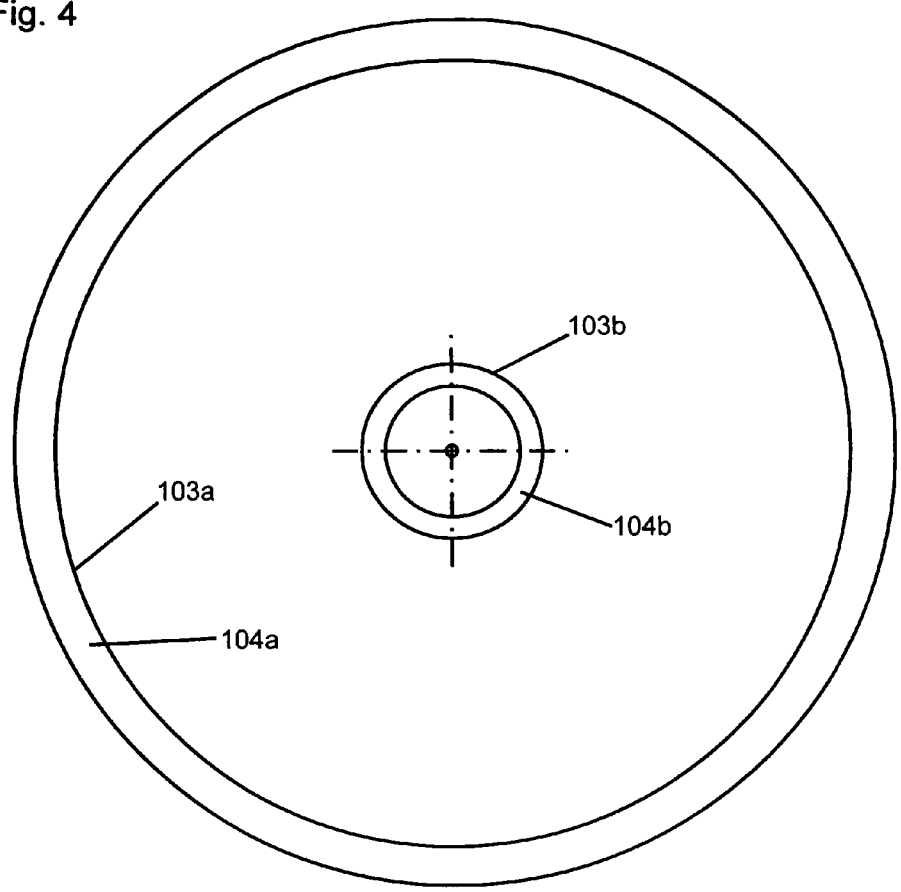
Figure 5:
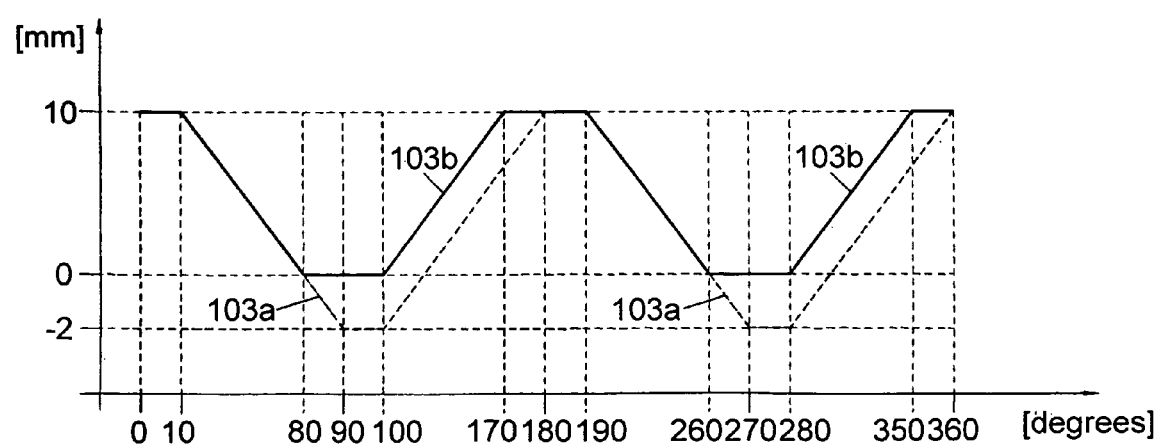
Figure 6:
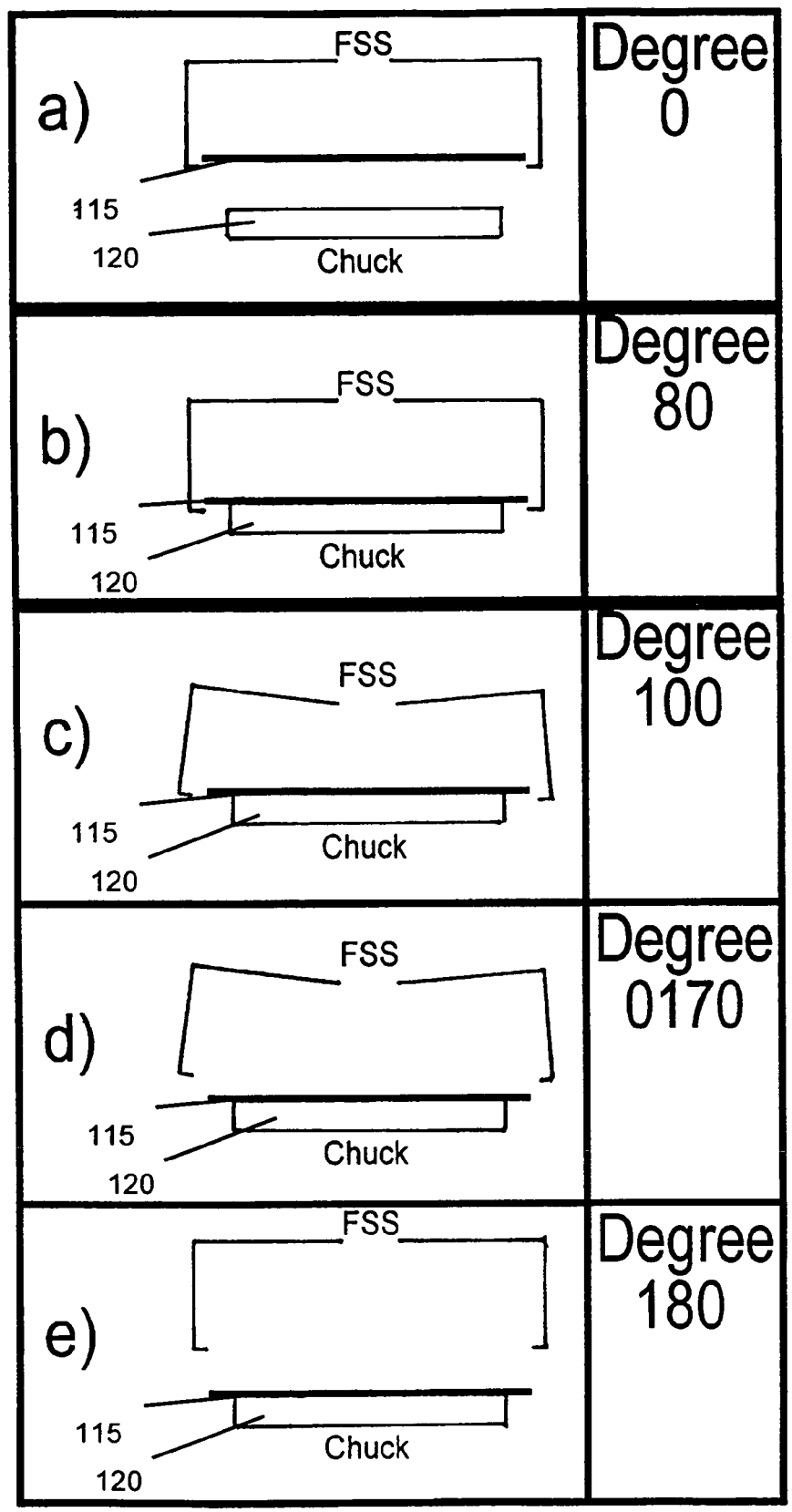
FIG. 6 a place cycle of the arms.
Figure 7:
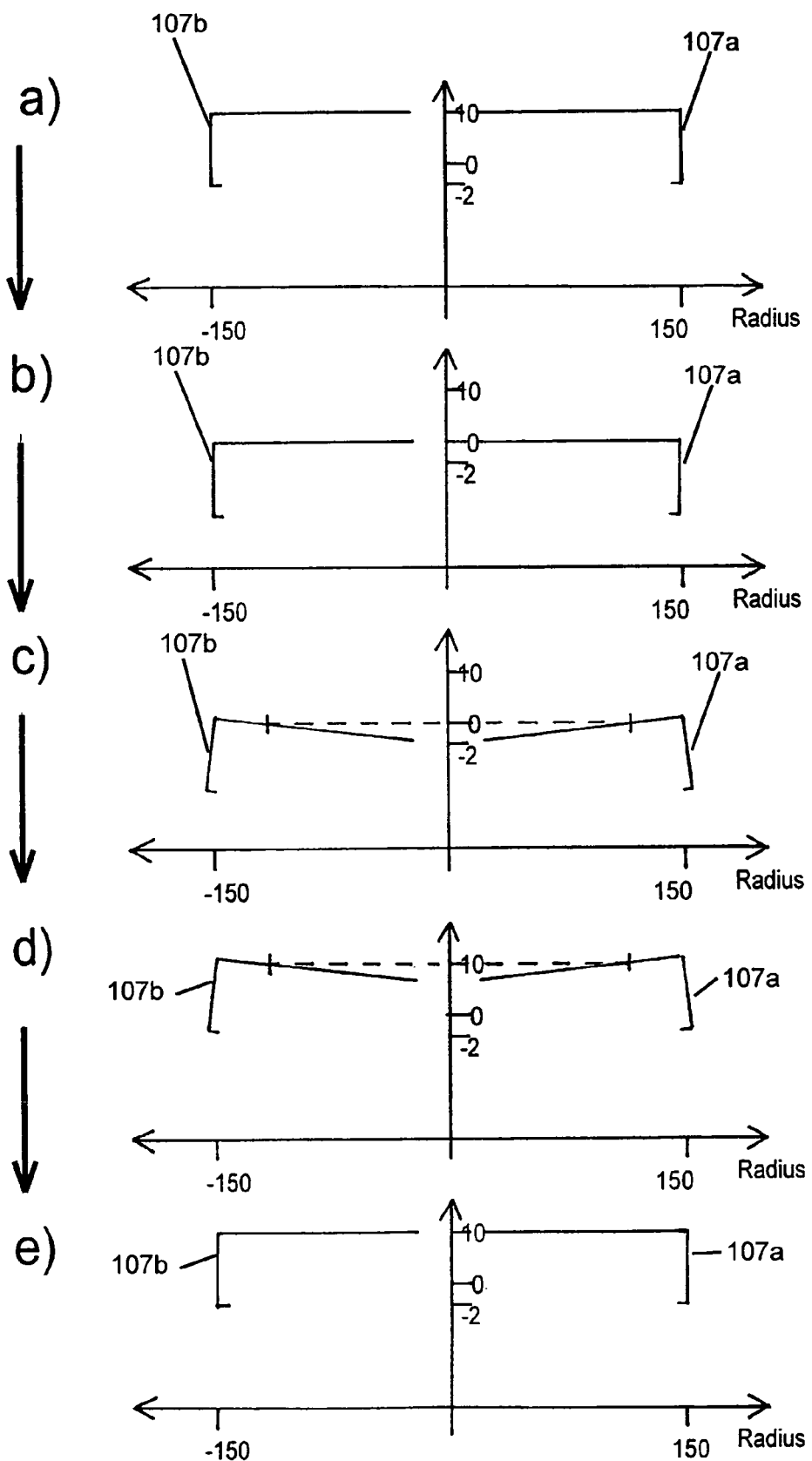
FIG. 7 a moving flow chart of the arms.

In order to achieve this motion a profile or cam structure 103a and 103b of the contour is provided as shown in FIG. 5. FIG. 5 displays in part a projection of the cam 103a and 103b of the profile rings 104a and 104b (FIG. 4). From 0° to 10° both contours 103a, 103b are stable at a height of 10 mm. From 10° to 80° both profiles drop parallel, whereby in the projection of FIG. 5 the contour lines coincide. In this way the rotation of the plate or disk 104 leads to a down movement of the arms without opening of the arms (see also FIGS. 6a, 7a and 6b, 7b). After 80° the outer contour 103a drops more than that inner contour 103b, i.e. down to minus 2 mm. Thus, the arms 107a and 107b turn around the fulcrums 114a and 114b to open the grippers 119 and the arms, respectively, (FIG. 6c, 7c). From 100° to 170° both profiles moving parallel with a constant difference so that the arms go up, but stay open (FIG. 6d, 7d). From 170° to 180° the outer profile 103a comes to the same height as the inner one 103b. The arms close again (FIG. 6e, 7e).

A further movement of the plate 104 in the same direction up to a 360° would repeat the transfer motion described above. However, if the motion of disk 104 is reversed instead of the described place cycle a pick cycle would be initiated starting with the end position of the place cycle and ending with the start or up position of the place cycle.

This functionality is also demonstrate in FIGS. 7a to 7e the arms 107 (107a and 107b) first move down from a height of 10 mm to the zero level point, which marks the maximum down positioning of the arms 107. A further rotation of the disk leads to the opening of arms and to the placing of the wafer on the chuck. By rotating backwards, i.e. from the 360° position to the 180° position or from the 180° position to the 00 position a wafer can be picked from the chuck and can be brought to the upper or storage position.

Thus the functionality allows a fast swapping of wafers at the chuck with a handling tool that can handle only one wafer: Thereby the robot with only one arm puts the new wafer in the FSS-1, which is closed, by moving the wafer into the correct center position with an increased height to overcome the outer rims of the wafer retainer structure 119a and 119b. Than the robot (not shown) places the wafer down onto the support structure. Now the robot picks the old wafer from a chuck. After the wafer is removed from the chuck the FSS-1 places the wafer onto the chuck 120 by moving the sequence from FIG. 6a to 6e or 7a to 7e.

The FSS-1 is now ready to accept the next wafer and the fast swapping cycle can start from the beginning.

In the following reference is made to FIG. 8, wherein a front side perspective view of a further embodiment of the inventive apparatus FSS-2 is shown. FSS-2 displayed in FIG. 8 comprises tong-like arms 207 (right arm 207a and left arm 207b) and a driving mechanism 201. Each of the arms 207 consist of a guiding member 208 (208a right arm and 208b left arm), an extension member 209 (209a right arm and 209b left arm), a leg 210 (210a right arm and 210b left arm), and a gripper 99 (99a right arm and 99b left arm). The driving mechanism 201 is made up of an elevation contrivance 202 and a manipulator drive 203. It is the purpose of the manipulator drive to appropriately control, govern or drive the arms 207a, 207b, such that grippers 99a, 99b, in a tong-like movement, can pickup, hold, and release a wafer from a chuck or robot, etc. The upper leg 115a of the arm 107a has been inserted into or extends through the opening 102a of the housing 102, and is moveably attached to the fulcrum 114a of holding arm 110a of the support structure 110 to form a lever apparatus, which allows the upper leg 115a under defined circumstance, which will be described hereinafter, to change its angle with respect to the horizontal line and the holding arm 110a respectively. The upper leg 115a with its end inside of the FSS-1 housing 102 has a roller 108a rotatably fixed at its end, whereby the roller 108a is supported by the second topography 103a of the rotating plate 104. The upper leg 115a, and thus the support structure arm 110a too, is held down or pushed against to the contour circles 104a or cam structure 103a with the spring 109a. For this purpose the spring 109a is fixed to the upper leg 115a and the bottom part of the housing 102 at a point between the roller 108a and the bearing fulcrum 114a depending on the force to be excerpted on to the upper leg 115a and the contour profile 103a, respectively.

The elevation contrivance or device 202 encompasses a rectangular base plate to which an actuator 205 centrally is attached. At the front end corners of the base plate 204, the base plate 204 comprises through holes for attaching the base plate. The actuator 205 is a linear actuator, which has a spindle 216 at one side. For to accommodate actuator 205 on the base plate 204, base plate 204 further comprises a centrally positioned through whole, through which the actuator spindle 216 extends. It is the function of the elevation contrivance 202 to elevate manipulator drive 203 in a direction perpendicular to a plan defined by the movement of the arms 207a and 207b. Therefore the elevation contrivance 202 is affixed to the top side of the housing 227 of the manipulator drive 203 via its spindle 216 and linear guides 210 (linear guide 210a to the right side and linear guide 210b to left side of the actuator). The linear guides 210a, 210b consist of a pin 212 (212a and 212b) (FIG. 9) and a guide 211 (211a and 211b) which guide the elevation movement. The pins 212 are symmetrically arranged with respect to the linear actuator 205 and extend through respective holes, which are comprised by the base plate 204. Pins 212 are attached to base plate by guide clamps 206 (206a and 206b), and co-operate with the guides 211, which are affixed to the top surface of housing 227 by means of flanges. Thus actuator 205, with its spindle, can move the housing 227 of manipulator drive 203 up and down if the actuator is appropriately charged by current via cable 214. On the front side of housing 227, in central position on the front, a holder 213 is attached to the housing 227, which carries a scanning sensor 226 that detects or checks the presents of wafer 215, i.e. it detects whether the arms 207 bear a wafer or not. The sensor 226 is fastened to the free end of holder 213, whereby the holder extends from housing 227 such that at least wafers or disks with two different diameters, for instance of 200mm and 300mm, can be detected.

Figure 8:
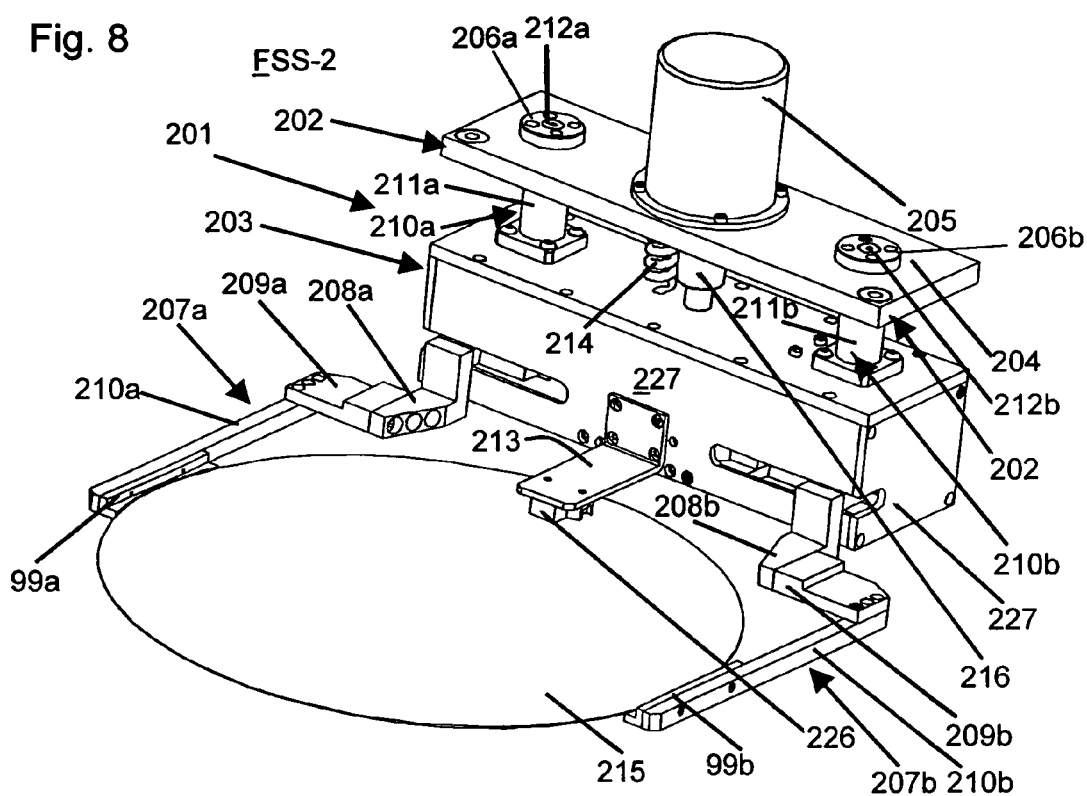
FIG. 8 a perspective view of the front side of another embodiment according to the invention, FIG. 9 a perspective view of the back side of the embodiment of FIG. 8, FIG. 10 a schematic top view of the manipulator drive together with the tong-like arms of FIG. 8 except that the manipulator drive just comprises one actuator for driving the lead screws and the tong-like arms respectively, FIG. 11 a schematic top view as shown in FIG. 10 except that the manipulator drive comprises a manipulator-belt-drive assembly for driving the lead screws and the tong-like arms respectively, FIG. 12 a schematic top view of another embodiment of the manipulator drive and the tong-like arms of an inventive swapping apparatus, wherein the manipulator drive comprises a gear drive and lever apparatus for driving the tong-like arms.
Figure 9:
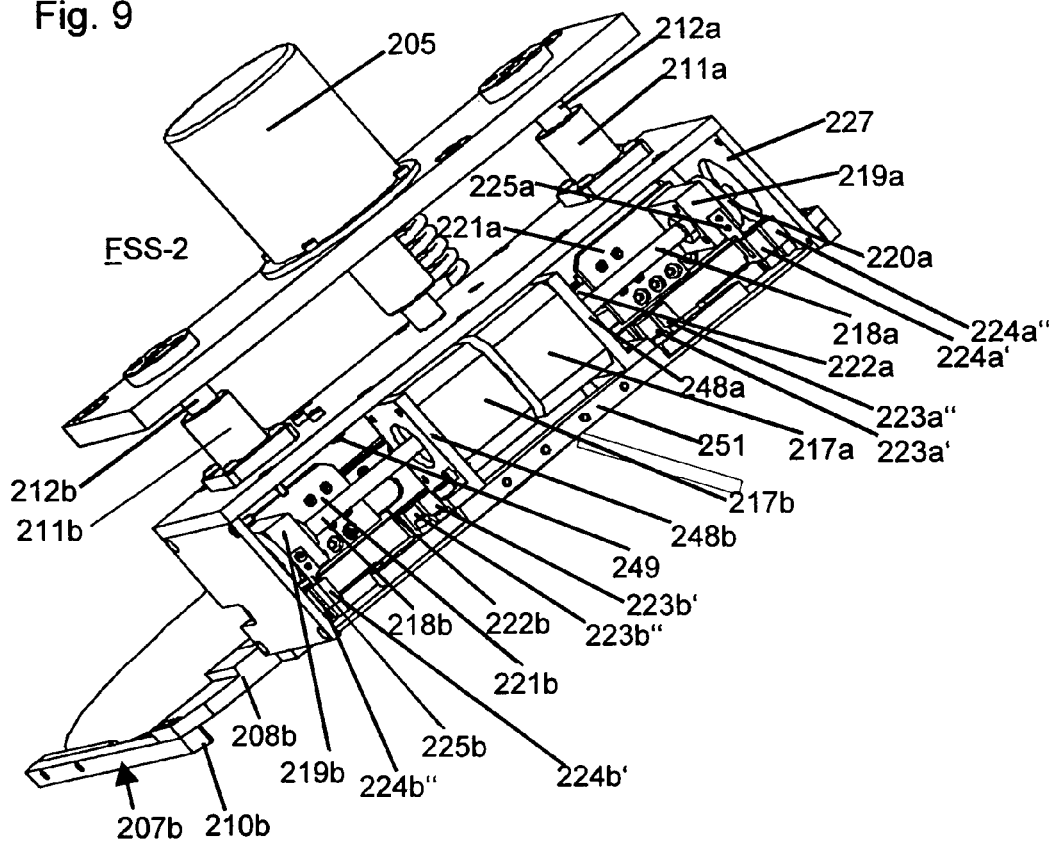

Turning now to FIG. 9, wherein the back side of the swapping apparatus FSS-2 of FIG. 8 can be seen. Note that there, the back plate of housing 227 of the manipulator drive has been removed. Thus, FIG. 9 freely shows the functional elements of manipulator drive 203. Therein two sides can be differentiated. The mechanism on the right drives the right arm 207a and the mechanism on the left drives the left arm 207b. The technical features of both sides are the same. Therefore the following description of the technical parts will be restricted to just the right hand side. The driving mechanism on the right side comprises a motor or linear actuator 217a (217b) which is held by bracket 248a (248b), and which drives a lead screw 218a (218b) that co-operates with the female thread of bracket nut 219a (219b), whereby, depending on the sense of direction of lead screw 218a (218b) bracket nut 219a is either moved to left or to right. Lead screw nut 220a (220b) secures bracket nut 219a (219b). Bracket nut 219a (219b) itself is connected with linear slide 221a (221b) which is joint with guiding member 208a (208b) (see FIG. 8). Linear slide 221a (221b) is guided by linear guide 222a (222b) in parallel to lead screw 218a (218b). Two pairs of limit sensors 223a (223b) and 224a (224b) are arranged along the guiding way of linear slide 221a (221b). The sensors 223a (223b), 224a (224b) interact with flag sensor 225a (225b) which is lodged to linear slide 221a (221b). The first pair of sensors 223a (223b) is positioned along the guide way such that a 200 mm wafer can be either released/picked or held by the arms' grippers 99b. This means that, in case when the bracket nut 219a (219b) and guiding member 208a (208b), respectively, is moved to the left side (the same is valid if guiding member 208b of the left side is moved to the right) the inner sensor 223a' (223b') of the pair 223a (223b) indicates via sensor flag 225a (225b) that arm 207a (207b) or gripper 99a (99b) has the right position to hold wafer 215 (FIG. 8), whereas if the guiding member 208a (208b) or gripper 99a (99b) is moved to the right (left) the outer sensor 223a" (223b") of the pair 223a (223b) indicates via flag sensor 225a (225b) that the guiding member 208a (208b) or gripper 99a (99b) has moved far enough that there will be no interference with the wafer left on a chuck or to be picked from a chuck, and thus, in any case, no damage of the wafer 215 will occur. The second pair of sensors 224a (224b) has the same functionality for wafers or disks with a diameter of 300 mm. Thus, the inventive swapping apparatus advantageously includes the possibility to swap disk-like members or wafers of different diameters. Moreover, a further sensor or limit switch 249 at the inside of the top plate of the housing 227 is provided which indicates the distance between the manipulator drive 203 and the elevation contrivance 202.

Another advantageous feature of the FSS-2 according to FIGS. 8 and 9 is the fact that the inventive swapping station can be front as well as back loaded. Structurally this is provided by the fact that the arms 207a and 207b are formed and hanged up on the manipulator drive 203 such that the grippers 99a, 99b are free accessible from the front and the back side of housing 227. For that function the part of guiding members 208a and 208b extending through the guiding apertures of the housing 227 is cranked, and the legs 210a, 210b are attached to the adjustable extension members 209a, 209b, which link the respective guiding members 208a, 208b and legs 210a, 210b, such that an offset of the grippers 99a, 99b and the legs 210a, 210b with respect to the outer side of base plate 251 of housing 227 is achieved. The offset preferably is 10 mm.

Although not shown in FIG. 8 or FIG. 9, the displayed apparatus of course also comprise appropriate interfaces and cables connected thereto for a remote control of the apparatus' movements.

Figure 10:
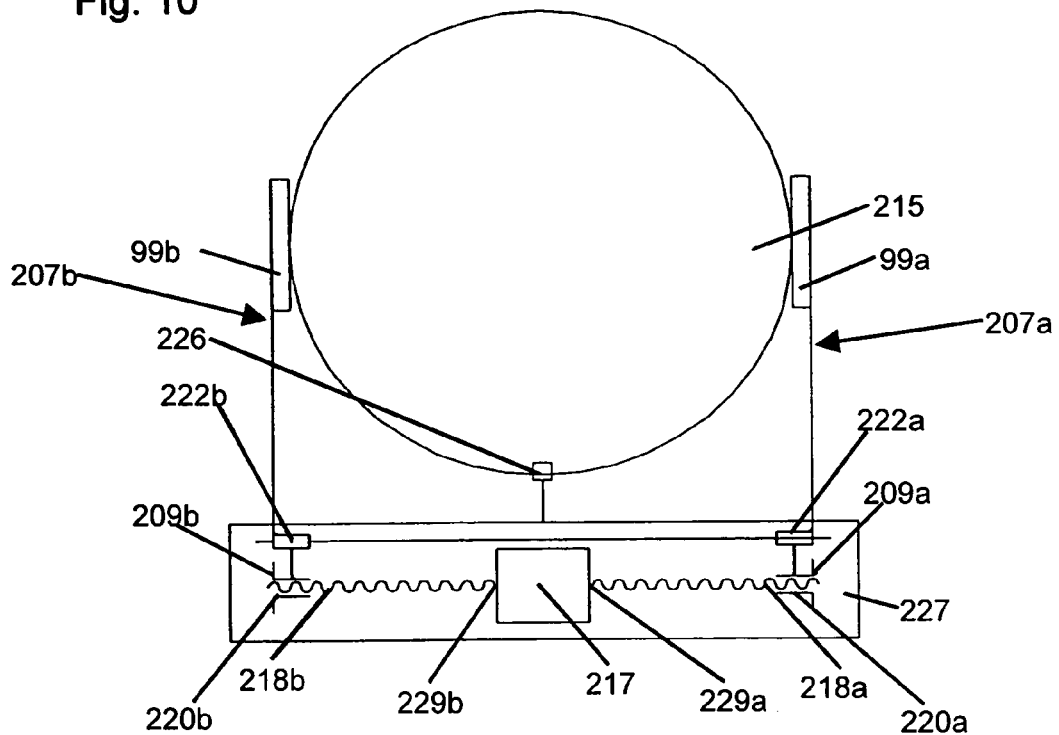

A slightly different embodiment of the invention, if compared to that according to FIGS. 8 and 9, is shown in FIG. 10. Therein a schematic top view of the manipulator drive together with the tong-like arms of FIG. 8 is illustrated which differentiates in the fact that not two motors or linear actuators 217a, 217b are used but only one actuator 217 to drive the twin lead screws 218a, 218b and thus the arms 207 or grippers 99 on the right and on the left in FIG. 8 or 9. However for to get the tong-like movement of the arms 207a and 207b the lead screws preferably have different thread leads, i.e. the twin lead screws could be for instance to the right 218a left-hand threaded and that to the left 218b right-hand threaded or vice versa. Of course, the same effect could be achieve if the single actuator or motor 217 were able to provide two different driving directions for the two twin lead screws 218a and 218b with the same lead each. Thus, if driven by the motor 217, twin lead screws 218a and 218b cause an anti-parallel tong-like movement of the arms 207a, 207b.

Figure 11:
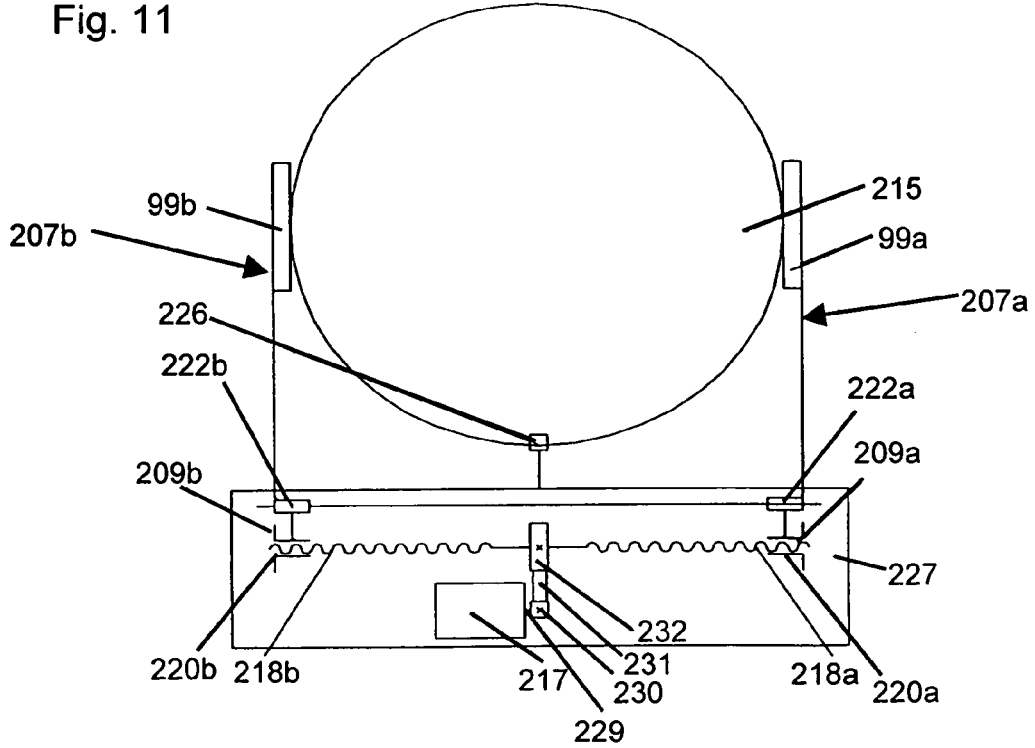

In the embodiment of FIG. 11 the single motor or actuator 217 with two driving shafts 229a and 229b (FIG. 10) for the twin lead screws 218a, 214b is replace by a motor 217 with merely one driving shaft 229 which drives a pulley 230 that by means of a belt drive 231 runs a driven pulley 232. The driven pulley is axially connected with the two twin lead screws 218a and 218b, as it is case with respect to motors according to FIG. 8 to 10. This kind of assembly just provides one sense of rotation of the driven pulley 232 and the twin lead screws 218a and 218b. Therefore, the lead screws 218a and 218b have to have opposed thread leads for a tong-like movement of the arms 207a and 207b.

Figure 12:
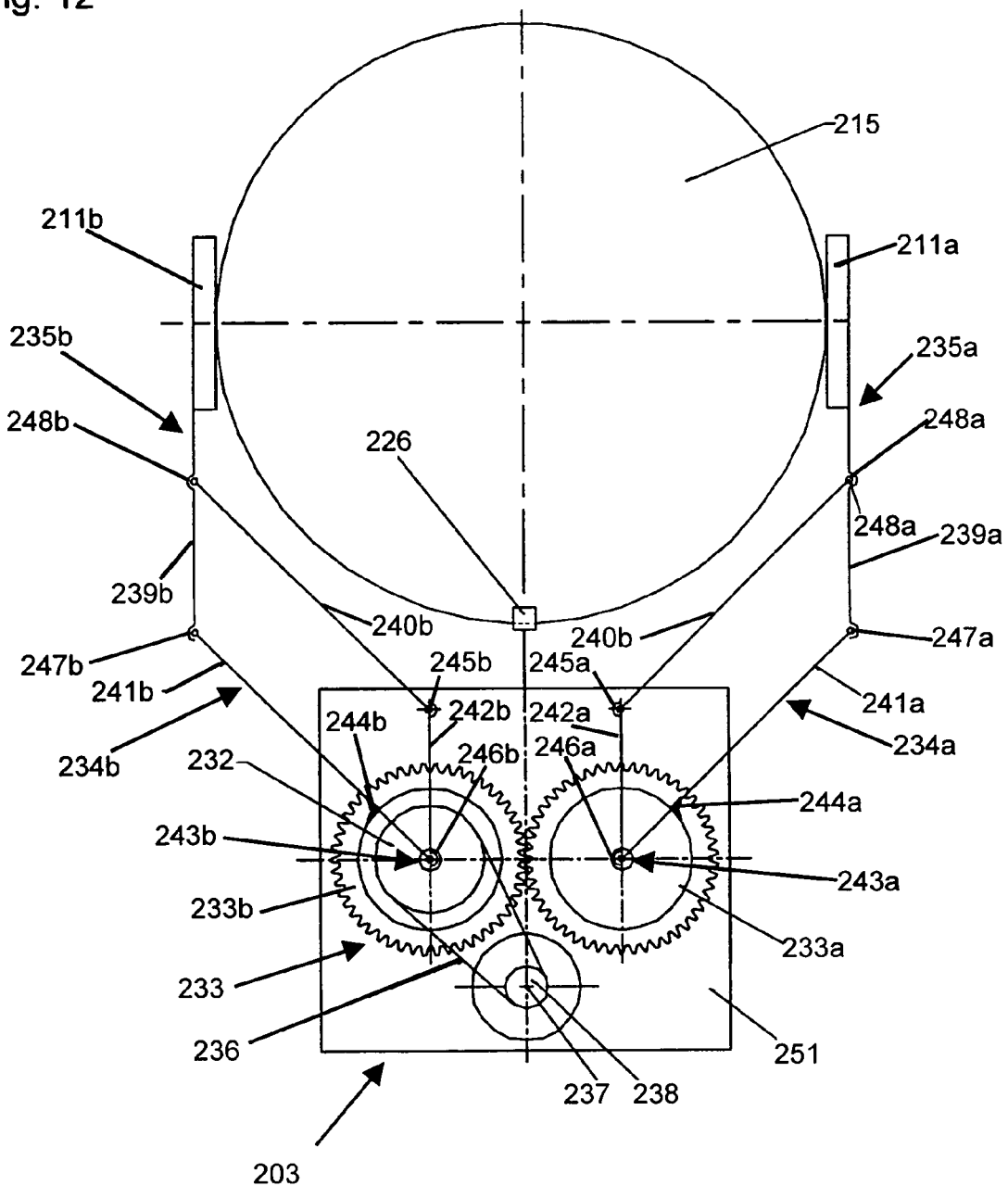

FIG. 12, as FIGS. 10 and 11, displays, under omission of the elevation contrivance 202 (FIGS. 8, 9), a schematic top view of a further embodiment of the manipulator drive 203 and the tong-like arms, whereby, as in FIGS. 10 and 11 the elevation contrivance, remains the same as in FIGS. 8 and 9. Manipulator drive 203 in FIG. 12 comprises a gear drive 233 and a lever apparatus 234 (234a and 234b) for driving the tong-like arms 235 (235a and 235b). The gear drive 233 consists of two gears 233a and 233b, which are in mesh. One of the gears 233b is driven by a pulley 238 via pulley 232, which has a rearward position inside the manipulator 203 on the symmetry axis of the swapping. This pulley 238 is driven via belt drive 236, which transfers the motion of a driving pulley 238 that is attached to and driven by an actuator or motor 237.

The lever apparatus 234 of FIG. 12 encompasses two lever structures 234a and 234b. Part of the lever apparatus or structures 234a and 234b are the tong-like arms 235a and 235b. Each of the lever structures 234a and 234b forms a parallelogram of four levers 240, 241, 242 including the portions 239a and 239b of the arms 235a and 235b. In each of the lever structures 234, for gripping the wafer by means of the grippers 99a and 99b, the arms 235 and thus the portions 239 (239a and 239b) too are brought into a position parallel to a tangent on the edge of the disk or wafer 215. Each of the lever structures 234a and 234b comprises four cylindrical joints, which form the edges of the parallelogram. The joints 245 and 246 at the ends of the levers 242a and 242b parallel to the arms' portions 239a and 239b are locally fixed inside the manipulator drive 203, whereby the levers 242 extend parallel to the gear wheels 233, and whereby the joints 246a and 246b at the ends of levers 242a and 242b opposed to the wafer are locally affixed to the hubs 243a and 243b of gear wheels 233a and 233b. Moreover, with respect to the lever apparatus 234a (234b) lever 241a (241b on the left side), which is parallel to lever 240a (240b on the left side), is pinned to pinion or gear 233a (233b on the left side) by means of attachment point 244.

On the basis of the above described structural elements of the embodiment according to FIG. 12 it is provided that if the actuator 237 drives or turns left gear wheel 233b to the left right gear wheel 233b will be turn to the right. Since lever 241a and 241b are fixed to the respective gear wheels 233a and 233b and are jointly fixed at the hubs 243a and 243b, these levers will be also turned to the respective direction, i.e. lever 241a will turn to the right around turning point 243a, and lever 241b will be turned to the left around turning point 243b, whereupon the levers 240a and 240b being parallel to levers 241a and 241b will follow the movement of levers 241a and 241b around the affixed joints 245a and 245b. By, for instance, turning the levers 241b and 240b to the left the distance of their free ends 247b and 248b will be increased with respect to the wafer 215, which results in a movement of the arm 235b to the left. Since levers 241b and 240b rotate the same angle to the left, there is a parallel offset of arm 235 to the left. The functional description for the left lever structure 235b is also valid for the right lever structure with the exception that the levers act in opposite direction. This is of course necessary for achieving the tong-like movement of arms upon which wafer 215 is supposed to be gripped or released.

Now reference is made to FIG. 13. FIG. 13 shows the accelerated handling process or transfer of a wafer according to the invention from, for instance, a wafer container-cassette to, for example, an inspection station (both not shown). In that process, a wafer, which has just been inspected, is brought by a chuck of a x-y-stage to an exchange-region EXR. Therein, one of the inventive swapping apparatus FSS-1 or FSS-2 is located and awaits the coming of the wafer 315 (FIG. 13A). The arms 307a and 307b of the swapping apparatus FSS-2 are in their down and open position. Functionally, this could be for instance done be the elevation contrivance 202 and by the manipulator drive 203 according to one of the described embodiments. In FIG. 13B the x-y stage with chuck 320 moves the wafer 315 into the inventive swapping station FSS-2, i.e. between the arms of FSS-2. Swapping station FSS-2 grips and lifts, i.e. front loads the wafer from the chuck by means of the inventive driving mechanism 301 and the arms 307a and 307b. Having just picked the wafer from chuck 320 a new wafer 315' to be inspected is brought to the exchange-region EXR by robot 350. The robot places new wafer 315' onto chuck 320 beneath swapping station FSS-2 (FIG. 13C). Now the x-y-stage retracks chuck 320 from the exchange position EXR to the inspection station with new wafer 315' (FIG. 13D). After or parallel to this robot 350 picks the old wafer 315 from the FSS-2 and retracks its arm with the old wafer 315 from the inventive swapping station FSS-2 (FIG. 13E). In the following, chuck 320 and robot 350 are both retracked, whereby robot 350 holds old wafer 315 and the chuck the new wafer 315' (FIG. 13F).

FIGS. 14A to 14F show the same process as FIGS. 13A to 13F with the difference that the swapping station FSS-2 or FSS-1 is first back-loaded with a new wafer 315', and afterwards releases the new wafer 315' to the chuck. Thus, the first picture FIG. 14A shows robot 350 coming to the exchange region EXR, where the FSS-2 waits to accept wafer 315'. Having arrived at the exchange position the robot, beneath the FSS-2, places the new wafer on the FSS-2, which is, with its arms, in the up and hold position (FIG. 14B). Parallel and/or after this the x-y-stage with its chuck comes to the exchange region EXR or exchange position, where the arms of the FSS are positioned. The robot handler 350 retracks from the swapping station FSS-2 (FIG. 14C). Arrived at the exchange position, the robot gets the old wafer 315 from the chuck of the x-y-stage (FIG. 14D). Now, Robot 350 retracks its arm with the old wafer 315 from the chuck 320, and the FSS places new wafer 315' onto the chuck 320 of the x-y-stage (FIG. 14E). Then, x-y-stage retracks chuck 320 with new wafer 315', and Robot 350 brings the old wafer 315 to, for instance, a container-cassette.

Although the preferred embodiments of the invention has been described, it is to be understood that the invention is capable of other adaptations and modifications within the scope of the appended claims.

The invention claimed is:

1. An apparatus for swapping a disk member, said apparatus comprising:
   at least two tong arms for accepting and holding the disk member; and
   a driving-mechanism adapted to drive said at least two tong arms, wherein said driving-mechanism is adapted to provide a first movement and a second movement to said at least two tong arms following the topography of a cam structure, said first movement comprising a vertically oriented movement of said at least two tong arms between an up position and a down position, said second movement comprising a horizontally oriented tong movement of said at least two tong arms, wherein said at least two tong arms turn around fulcrums.

2. The apparatus according to claim 1, wherein said driving-mechanism comprises a lever apparatus and/or spindle means for controlling said first and second movements.

3. The apparatus according to claim 1, wherein said driving-mechanism, when performing said second movement, moves said at least two tong arms between at least one hold position and at least one release position.

4. The apparatus according to claim 3, wherein said at least one hold position is two different hold positions and said at least one release position is two different release positions corresponding to said two different hold positions.

5. The apparatus according to claim 1, wherein said driving-mechanism comprises an elevation device and a manipulator drive.

6. The apparatus according to claim 1, wherein said at least two tong arms comprise extension members.

7. The apparatus according to claim 1, wherein said at least two tong arms comprise means for gripping the disk member.

8. The apparatus according to claim 7, wherein said gripping means comprises at least one grooved circular ring section adapted to a dimension of the disk member.

9. The apparatus according to claim 1, further comprising a housing including at least a part of said driving-mechanism.

10. The apparatus according to claim 1, wherein said at least two tong arms are formed to be front-loaded or back-loaded.

11. The apparatus according to claim 1, wherein said driving-mechanism comprises at least one driving motor.

12. The apparatus according to claim 1, wherein said at least two tong arms are affixed to said driving-mechanism.

13. The apparatus according to claim 1, further comprising means for detecting the disk member and/or for detecting a position of said at least two tong arms.

14. The apparatus according to claim 1, further comprising means for controlling said driving mechanism to control movement of said at least two tong arms.

15. A method for handling or transporting disk members, comprising:
   transporting a first disk member with a first transporter from a first position to an exchange region;
   loading said first disk member into said exchange region;
   transporting a second disk member with a second transporter to said exchange region;
   loading said second disk member from said second transporter to said first transporter;
   transferring said first disk member from said exchange region to said second transporter; and
   transporting said first disk member to a second position with said second transporter.

16. A handling line for handling disk members, comprising:
   a disk member exchange region;
   a first transporter having a first set of arms and a first driving-mechanism adapted to drive said first set of arms, said first driving-mechanism providing said first set of arms with a first movement and a second movement, said first movement comprising a vertically oriented movement and said second movement comprising a horizontally oriented tong movement;
   a second transporter having a second set of arms and a second driving-mechanism adapted to drive said second set of arms, said second driving-mechanism providing said second set of arms with a first movement and a second movement, said first movement comprising a vertically oriented movement and said second movement comprising a horizontally oriented tong movement; and a controller for controlling said first set of arms to move through its first and second movements so that a first disk member is transferred to said exchange region, and said second set of arms to move through its first and second movements so that a second disk member is transferred to said first transporter at said exchange region.

17. The handling line according to claim 16, wherein said first transporter and/or said second transporter comprises a device selected from the group consisting of an x-y-stage, a chuck, and a robot.

18. The handling line according to claim 16, wherein said controller controls said second transporter to transfer said first disk member from said exchange region to said second transporter.

19. The handling line according to claim 18, wherein said controller controls said second transporter to move said first disk member to a second position.

20. An apparatus for swapping a disk member, said apparatus comprising:

at least two tong arms having grippers for accepting and holding the disk member, said at least two tong arms being adapted to be front-loaded or back loaded with the disk member; and a driving-mechanism adapted to drive said at least two tong arms, wherein said driving-mechanism is adapted to provide a first movement and a second movement to said at least two tong arms, said first movement comprising a vertically oriented movement of said at least two tong arms between an up position and a down position, said second movement comprising a horizontally oriented tong movement of said at least two tong arms, wherein said driving-mechanism comprises a lever apparatus and/or spindle means for controlling said first and second movements, said lever apparatus and/or spindle means being accommodated in a housing having a front side with guiding apertures for said at least two tong arms, and a back side, wherein said at least two tong arms include crank guiding members extending through said guiding apertures and being formed so that said grippers show a vertical offset to said housing and are accessible from said front side and said back side of said housing to be front-loaded or back-loaded with the disk member.

21. The apparatus according to claim 20, wherein said driving-mechanism, when performing said second movement, moves said at least two tong arms between at least one hold position and at least one release position.

22. The apparatus according to claim 21, wherein said at least one hold position is two different hold positions and said at least one release position is two different release positions corresponding to said two different hold positions.

23. The apparatus according to claim 20, wherein said at least two tong arms comprise extension members.

24. The apparatus according to claim 20, wherein said at least two tong arms comprise means for gripping the disk member.

25. The apparatus according to claim 24, wherein said gripping means comprises at least one grooved circular ring section adapted to a dimension of the disk member.

26. The apparatus according to claim 20, further comprising a housing including at least a part of said driving-mechanism.

27. The apparatus according to claim 20, wherein said at least two tong arms are formed to be front-loaded or back-loaded.

28. The apparatus according to claim 20, wherein said driving-mechanism comprises at least one driving motor.

29. The apparatus according to claim 20, wherein said at least two tong arms are affixed to said driving-mechanism.

30. The apparatus according to claim 20, further comprising means for detecting the disk member and/or for detecting a position of said at least two tong arms.

31. The apparatus according to claim 20, further comprising means for controlling said driving mechanism to control movement of said at least two tong arms.

32. The apparatus according to claim 1, wherein said disk member comprises a wafer or a plate.

33. The method according to claim 15, wherein said disk member comprises a wafer or a plate.

34. The handling line according to claim 16, wherein said disk member comprises a wafer or a plate.

35. The apparatus according to claim 20, wherein said disk member comprises a wafer or a plate.

* * * * *